United States Patent [19]

Marschall et al.

[11] Patent Number: 4,692,926
[45] Date of Patent: Sep. 8, 1987

[54] MUSHROOM-SHAPED SEMICONDUCTOR STRIPE LASER

[75] Inventors: Peter Marschall, Neu-Ulm; Ewald Schlosser, Senden; Hans-Peter Vollmer, Brandenburgweg, all of Fed. Rep. of Germany

[73] Assignees: Licentia Patent-Verwaltungs-GmbH, Frankfurt am Main; ANT Nachrichtentechnik GmbH, Backnang, both of Fed. Rep. of Germany

[21] Appl. No.: 727,251

[22] Filed: Apr. 25, 1985

[30] Foreign Application Priority Data

May 25, 1984 [DE] Fed. Rep. of Germany ....... 3419600

[51] Int. Cl.⁴ .............................................. H01S 3/19
[52] U.S. Cl. .................................................. 372/46
[58] Field of Search ...................... 372/46, 44; 357/17

[56] References Cited

U.S. PATENT DOCUMENTS 3,865,646  2/1975  Logan et al. ........................... 372/46

OTHER PUBLICATIONS

H. Burkhard et al, "InGaAsP/InP Mushroom Stripe Lasers with Low CW Threshold and High Output Power", Japanese Journal of Applied Physics, vol. 22, No. 11, Nov. 1983, pp. L721–L723.

Primary Examiner—James W. Davie
Attorney, Agent, or Firm—Spencer & Frank

[57] ABSTRACT

A mushroom-shaped semiconductor stripe laser, particularly with transversal, monomode light distribution and a double heterostructure comprised of a substrate, a laser-active zone, a cover layer and an electrically contacting metal layer for the cover layer with the cover layer being underetched such that a mushroom-shaped structure is formed in which the laser-active zone is constricted to a stripe-shaped region. The ratio of the width of the cover layer to the width of the laser-active zone lies in a range between two and five, and the cover layer is electrically conductively connected with the metal layer on its outer surface as well as on at least one of its side surfaces.

19 Claims, 2 Drawing Figures

MUSHROOM-SHAPED SEMICONDUCTOR STRIPE LASER

BACKGROUND OF THE INVENTION

The present invention relates to a mushroom-shaped semiconductor stripe laser. More particularly, the present invention relates to a mushroom-shaped semiconductor stripe laser, particularly with transversal, monomode light distribution, including a semiconductor double heterostructure comprised of a substrate, a laser-active zone, and a cover layer, as well as a respective electrically contacting metal layer for the substrate and for the cover layer, and with the cover layer being underetched such that a mushroom-shaped structure is formed in which the laser-active zone is constricted to a stripe-shaped region.

Such a semiconductor laser is also called an MS laser ("mushroom stripe laser") and is disclosed, for example, in the publication *Japanese Journal of Applied Physics,* Volume 22, Nov. 1983, pages L721–L723. As shown in FIG. 1, which is a schematic illustration of the cross-section of such a known MS laser, a semiconductor substrate 1 has initially applied to it a further substrate layer 1' (buffer layer). On top of the outer major surface of layer 1' is a stripe-shaped laser-active zone 2, which has a first width b1 of approximately 1.5 micron, a height of approximately 0.1 micron and a length (perpendicularly to the plane of the drawing) of, for example, 150 microns. The laser-active zone 2 is covered over its entire length by a cover layer 3 which has a height of approximately 1.5 micron and a second width b2 of approximately 15 microns. Laser-active zone 2 as well as cover layer 3 therefore form a mushroom-shaped semiconductor structure which can be produced by an etching technique customarily employed in the semiconductor art (underetching of cover layer 3). This mushroom-shaped semiconductor structure is embedded in an oxide layer 4. This embedding in an oxide layer may cause cavities 5 to be formed in the oxide layer 4 below the cover layer 3. In the region of oxide layer 4 on the outer surface of the cover layer 3, a contact window 6 is provided so that it is possible to electrically contact cover layer 3 by way of a metal layer 7. A further such metal layer 7' is also provided on the underside or opposite major surface of substrate 1. The described arrangement is a laser diode with lateral wave guidance known as an index guided laser.

The described arrangement has the drawback that the ratio of the second width b2 to the first width b1 is very large (approximately 10). This produces, particularly for industrial mass production, an uneconomical proportion of unusable semiconductor lasers. For example, the mechanical stresses produced between the oxide layer 4 and the cover layer 3 are so great that they bring about undesirable separation of the cover layer 3 from the laser-active zone 2. Moreover, during the above-mentioned underetching of the cover layer 3, undesirable fluctuations occur in the first width b1. This makes it impossible, in particular, to always guarantee that monomode light distribution is assured in the finished semiconductor laser.

SUMMARY OF THE INVENTION

It is therefore an object of the present invention to provide a semiconductor mushroom-stripe (MS) laser type which can be produced in an economical and reliable manner and has precisely predeterminable characteristics so that, in particular, costly tests on the finished semiconductor laser can be avoided.

The above object is accomplished according to the present invention by a mushroom-shaped semiconductor stripe laser, particularly with transversal, monomode light distribution, which comprises: a semiconductor double heterostructure including a semiconductor substrate of one conductivity type, a stripe-shaped semiconductor laser-active zone disposed on one major surface of the substrate and a stripe-shaped semiconductor cover layer of the opposite type disposed on the outer surface of the laser active zone, with the laser-active zone having a width which is less than the width of the cover layer, as a result of the cover layer being underetched, so as to form a mushroom-shaped structure and with the ratio of the width of the cover layer to the width of the active zone lying in a range between two and five; a metal ohmic contact on the other major surface of the substrate; and a metal layer ohmically contacting the cover layer on its outer major surface and on at least one of its side surfaces. Preferably, the ratio of the width of the cover layer to the width of the stripe-shaped laser-active zone is approximately three.

According to a feature of the invention, the metal layer extends laterally over the major surface of the substrate and means are provided for preventing direct current flow between the substrate and the overlying portion of the metal layer. Such means may comprise a pn-junction formed in the substrate and extending to the major surface between the metal contact and the laser-active zone, and an electrically highly resistant layer provided between the substrate and the metal layer, e.g., an oxide layer, or a highly resistant surface layer of the substrate produced by conversion of the substrate surface.

According to a further feature of the invention, the surfaces of the cover layer contacted by the metal layer are highly doped so as to provide a low-ohmic transfer resistance at the contact.

According to the preferred embodiment of the invention, the substrate and the cover layer are formed respectively of n and p-type indium phosphide, the laser-active zone is formed of indium-gallium-arsenic-phosphide, and the highly doped surfaces of the cover layer and the pn-junction in the surface of the substrate are formed by a diffusion with zinc or cadmium.

The invention is based on the discovery that the magnitude of the second width b2 is essentially dependent upon the size of the contact window 6 (FIG. 1). This contact window 6, however, cannot be reduced in size at will, since a correspondingly high electrical current is required for the desired high light output of the semiconductor laser. This, however, is possible only with the smallest possible transfer resistance, particularly in the region of the contact window, since otherwise too much power could possibly be dissipated (in the form of heat) which would lead to destruction of the semiconductor laser. Moreover, a small contact window requires a small etching mask for the oxide layer which again requires more cost intensive manufacturing processes.

DETAILED DESCRIPTION OF THE PREFERRED EMBODIMENT

Figure 1:
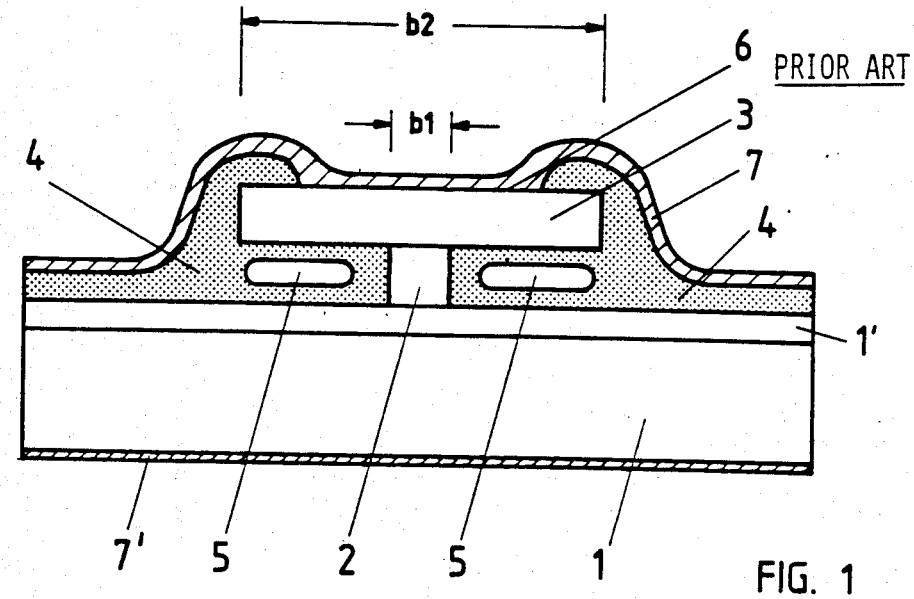
FIG. 1 is a cross sectional view of a mushroom-shaped stripe laser according to the prior art.
Figure 2:
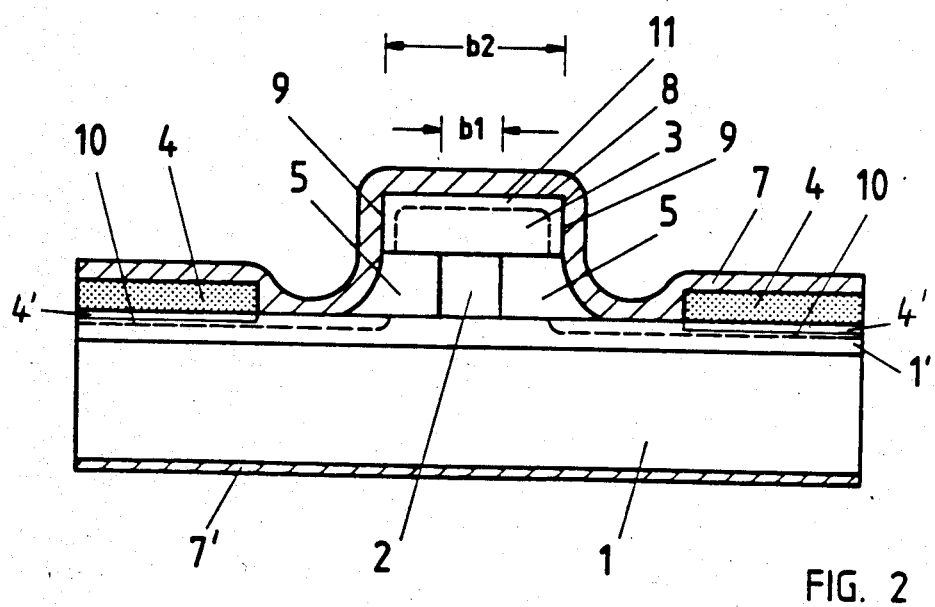
FIG. 2 is a cross sectional view of a mushroom-shaped stripe laser according to the present invention.

Referring now to FIG. 2, there is shown a mushroom-shaped semiconductor stripe laser according to the invention wherein the same reference numerals used in FIG. 1 are used to indicate corresponding parts. As shown, the semiconductor layers, including the basic substrate 1 with the substrate layer 1', the laser active zone 2, and the cover layer 3 form a mushroom-shaped stripe laser with a geometry similiar to that of the laser of FIG. 1, with the exception that the width b2 of the cover layer 3 in FIG. 2 is substantially reduced relative to the width b2 in FIG. 1. More particularly, according to the present invention, the width b2 of the cover layer 3 to the width b1 of the laser active zone 2 is selected such that it is within the range of two to five and preferably is approximately three, and corresponds to the desired size for the electrical contact for the cover layer 3. The stripe-shaped cover layer 3 is contacted by the metal layer 7 along its entire outer major surface 8 and along at least one side surface 9 (preferably along both side surfaces as shown) and extends laterally over the adjacent major surface of the substrate 1, 1'. As shown in FIG. 2, the metal layer 7 contacts the outer major surface of substrate layer 1' adjacent the mushroom-shaped structure and then extends laterally over an insulating layer 4. With this arrangement, no insulating layer is provided beneath the cover layer 3 but rather only air spaces 5 are provided.

To ensure a low-ohmic transfer resistance between the metal layer 7 and the cover layer 3, the surfaces 8 and 9 are additionally highly doped with a suitable dopant to form a highly doped surface region 11.

In order to prevent direct current transfer between the metal layer 7 and the substrate layer 1' or substrate 1, a region of a conductivity type opposite that of substrate layer 1' is provided in the surface of the substrate layer 1' beneath the laterally extending portion of the metal layer 7 so as to form a pn-junction 10. As shown, the pn-junction 10 extends to the outer major surface of substrate layer 1' within the space 5, and is spaced from the laser active zone 2.

To produce the embodiment of the mushroom-shaped stripe laser shown in FIG. 2, a basic substrate 1 of n-InP (n-conductive indium phosphide) is provided, and on this substrate 1 there is initially applied a sequence of semiconductor layers comprised of a substrate layer 1' of n-InP (buffer layer), a quaternary layer 2 of indium gallium arsenic phosphide (InGaAsP), from which the laser-active zone is formed, and a cover layer 3 of p-InP. In a subsequent first etching step, a mesa-shaped (in cross-section) semiconductor structure of layers 2 and 3 is produced with layer thicknesses which correspond to those of FIG. 1 but of a width corresponding essentially to the desired width b2. In a diffusion process with zinc (Zn) and/or cadmium (Cd), the pn-junction 10 is produced in the outer major surface of the substrate layer 1'. During this diffusion process, the very highly p-doped semiconductor region 11 is simultaneously produced in the p-InP cover layer 3 to provide good electrical contact with the subsequently applied metal layer 7. The magnitude of the Zn doping is, for example, $3 \cdot 10^{18}$ cm$^{-3}$. Thereafter, in a second etching step, the cover layer 3 is underetched so as to reduce the width of the laser-active zone 2 to the desired width b1 and produce the final mushroom structure. Subsequently the metal layers 7 and 7' are applied in a conventional manner.

The placing of the pn-junction 10 in a material (InP) having a higher band spacing than that in laser-active zone 2 (InGaAsP) has the result that the electrical current will flow essentially through the laser-active zone 2. Undesirable current flow between substrate layer 1' and the adjacent portions of the metal layer 7 is negligible.

To further reduce the undesirable current flow, it is advisable, prior to application of the metal layer 7, to apply an electrically insulating oxide layer 4, e.g. of pyrolytically produced $SiO_2$, onto the surface of the substrate layer 1'. The mask required for that purpose, which prevents coating of cover layer 3 and/or laser-active zone 2, can advantageously be aligned in an economical manner since no high precision adjustment processes are required. The spacing between the laser-active zone 2 and the oxide layer 4 is not significant within wide limits for the operationability of the semiconductor laser.

The insulating layer 4 is used in connection with the pn-junction 10 to provide an additional means to prevent the undesired urrent flow. It is therefore possible to omit layer 4.

Undesirable current flow can furthermore be avoided by an electrically highly resistant layer produced in substrate layer 1' and/or in substrate 1, e.g. due to implantation of protons at a voltage of approximately 150 keV and in a dosage between $10^{12}$ cm$^{-2}$ and $10^{15}$ cm$^{-2}$.

Alternatively the insulating layer 4 is replaceable by a ighly resistant implanted region 4' which is implanted into the substrate layer 1' and which does not penetrate into the undoped region of the substrate layer 1' as indicated in FIG. 2. Like the oxide layer 4, the implanted region 4' in connection with the pn-junction 10 likewise serves as an additional precaution to avoid undesired current-flow outside the active region 2. Accordingly, the spacing between the laser active zone 2 and the implanted region 4' is not critical and can be varied in a wide range.

According to the description given above, a mushroom type laser with a small ratio of width b2 to width b1 can be easily fabricated. This is in contrast to the conventional mushroom stripe lasers which use a ratio of typically ten. Principally, this ratio should be as small as possible in order to give a high yield during the underetching of layer 3 and to achieve a high mechanical stability. But for very small values of the ratio of b2 to b1, the contact resistance between layer 7 and layer 3 increases rapidly. Therefore a value of three for this ratio should be used preferably.

If in the described semiconductor laser, the metal layer 7' on the substrate side is connected with the negative pole of a voltage source of approximately 1.5 volts and the opposite metal layer 7 (on the side of the cover layer 3) is connected with the corresponding positive pole, a current applied which is greater than 15 mA (threshold current) produces an essentially monomode laser light whose wavelength lies in a range from 1.1 to 1.6 micron.

The present invention is not limited to the specifically described embodiment but can also be used similarly in connection with other embodiments, for example in a semiconductor layer constructed on a GaAs substrate. Accordingly, it will be understood that the above description of the present invention is susceptible to various modifications, changes and adaptations, and the same are intended to be comprehended within the meaning and range of equivalents of the appended claims.

What is claimed is:

1. A mushroom-shaped semiconductor stripe laser, particularly with transversal, monomode light distribution comprising: a semiconductor double heterostructure including a semiconductor substrate of one conductivity type, a stripe-shaped semiconductor laser-active zone disposed on one major surface of said substrate and a stripe-shaped semiconductor cover layer of the opposite conductivity type disposed on the outer surface of said laser-active zone, said laser-active zone having a width which is less than the width of said cover layer, as a result of said cover layer being underetched, so as to form a mushroom-shaped structure with the ratio of said width of said cover layer to said width of said laser-active zone lying in a range between two and five; a metal ohmic contact on the other major surface of said substrate; and a metal layer ohmically contacting said cover layer on its outer major surface and on at least one of its side surfaces.

2. A mushroom-shaped semiconductor stripe laser as defined in claim 1, wherein said ratio of said width of said cover layer to said width of said laser-active zone is approximately three.

3. A mushroom-shaped semiconductor stripe laser as defined in claim 1 wherein said metal layer electrically conductively contacts said cover layer along its entire said outer major surface and along its side surfaces.

4. A mushroom-shaped semiconductor strip laser as defined in claim 1 wherein said metal layer extends laterally, and continuously from at least the side of said cover layer whose side surface is contacted, over said one major surface of said substrate; and further comprising means for preventing direct current flow between said substrate and the overlying portion of said metal layer.

5. A mushroom-shaped semiconductor stripe laser as defined in claim 4, wherein said means for preventing direct current flow comprises a region of said opposite conductivity type formed in said one major surface of said substrate beneath said laterally extending portion of said metal layer and spaced from said laser-active zone.

6. A mushroom-shaped semiconductor stripe laser as defined in claim 5 wherein: said metal layer contacts said opposite conductivity type region; and said substrate is formed of a semiconductor material having a higher band spacing than the semiconductor material forming said laser-active zone.

7. A mushroom-shaped semiconductor laser as defined in claim 5 wherein said substrate is formed of n-InP and said opposite conductivity type region is formed by a diffusion of zinc or cadmium.

8. A mushroom-shaped semiconductor stripe laser as define in claim 4, wherein said means for preventing direct current flow includes at least one electrically highly resistant layer provided between said substrate and said portion of said metal layer.

9. A mushroom-shaped semiconductor stripe laser as defined in claim 8, wherein said electrically highly resistant layer is an electrically insulating oxide layer.

10. A mushroom-shaped semiconductor stripe laser as defined in claim 8, wherein said electrically highly resistant layer is a high resistance surface layer of said substrate produced by conversion of the substrate surface.

11. A mushroom-shaped semiconductor stripe laser as defined in claim 10, wherein said conversion is effected by ion implantation.

12. A mushroom-shaped semiconductor stripe laser as defined in claim 1, wherein the surfaces of said cover layer contacted by said metal layer are more highly doped than the remainder of said cover layer so as to provide a low-ohmic transfer resistance at the contact.

13. A mushroom-shaped semiconductor stripe laser as defined in claim 12, wherein said cover layer is formed of p-InP, and said highly doped surfaces of said cover layer are doped with zinc or cadmium.

14. A mushroom-shaped semiconductor stripe laser as defined in claim 1, wherein said substrate and said cover layer are formed of indium phosphide, and said laser-active zone is formed of indium-gallium-arsenic-phosphide.

15. In a mushroom-shaped semiconductor stripe laser, particularly with transversal, monomode light distribution, comprising a semiconductor double heterostructure having a semiconductor substrate of one conductivity type, a stripe-shaped semiconductor laser-active zone disposed on one major surface of said substrate, and a stripe-shaped semiconductor cover layer of the opposite conductivity type disposed on the outer surface of said laser-active zone and having a width which is greater than the width of said laser-active zone as a result of said cover layer being underetched, a first metal contact layer ohmically contacting the other major surface of said substrate, and a second metal contact layer ohmically contacting the outer major surface and at least one of the side surfaces of said cover layer; the improvement wherein: the ratio of said width of said cover layer to said width of said laser-active zone is in a range between two and five; said second metal contact layer extends continuously and laterally from the side of said cover layer whose side surface is contacted over said one major surface of said substrate; and means are provided beneath the laterally extending portion of said second metal contact layer for preventing direct current flow between said substrate and the overlying portion of said second metal contact layer.

16. A mushroom-shaped semiconductor stripe laser as defined in claim 15, wherein said means for preventing direct current flow comprises a region of said opposite conductivity type which is formed in said one major surface of said substrate beneath said laterally extending portion of said second metal contact layer, which is spaced from said laser-active zone, and which is at least partially contacted by said laterally extending portion of said second metal contact layer.

17. A mushroom-shaped semiconductor stripe laser as defined in claim 16, wherein said means for preventing direct current flow further includes an electrically highly resistant layer provided between the uncontacted portion of said opposite conductivity type region and the overlying portion of said second metal contact layer.

18. A mushroom-shaped semiconductor stripe laser as defined in claim 17, wherein said electrically highly resistant layer is an electrically insulating oxide layer.

19. A mushroom-shaped semiconductor stripe laser as defined in claim 18, wherein said electrically highly resistant layer is a high resistance surface layer of said substrate produced by conversion of the substrate surface within a portion of said opposite conductivity type region.

* * * * *